(12) United States Patent
Kinsman

(10) Patent No.: US 6,383,839 B2
(45) Date of Patent: *May 7, 2002

(54) VERTICALLY MOUNTABLE SEMICONDUCTOR DEVICE AND METHODS

(75) Inventor: Larry D. Kinsman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/834,708

(22) Filed: Apr. 13, 2001

Related U.S. Application Data

(60) Continuation of application No. 09/407,482, filed on Sep. 28, 1999, now Pat. No. 6,239,012, which is a division of application No. 09/014,053, filed on Jan. 27, 1998, now Pat. No. 6,140,696.

(51) Int. Cl.$^7$ .......................... H01L 21/60; H01L 21/58; H01L 21/50
(52) U.S. Cl. ....................................... 438/107; 438/106
(58) Field of Search ................................ 438/106, 107, 438/109, 113, 119

(56) References Cited

U.S. PATENT DOCUMENTS

| | | | |
|---|---|---|---|
| 3,624,587 A | 11/1971 | Conrad .......................... 439/65 |
| RE34,794 E | 11/1994 | Farnworth .................. 257/678 |
| 5,444,294 A | 8/1995 | Suzuki ....................... 257/666 |
| 5,444,304 A | 8/1995 | Hara et al. .................. 257/796 |
| 5,450,289 A | 9/1995 | Kweon et al. ............... 361/773 |
| 5,451,815 A | 9/1995 | Taniguchi et al. .......... 257/696 |
| 5,468,991 A | 11/1995 | Lee et al. .................... 257/666 |
| 5,592,019 A | 1/1997 | Ueda et al. .................. 257/666 |
| 5,619,067 A | 4/1997 | Sua et al. .................... 257/686 |
| 5,635,760 A | 6/1997 | Ishikawa .................... 257/692 |
| 5,668,409 A | 9/1997 | Gaul .......................... 257/723 |
| 5,719,438 A | 2/1998 | Beilstein, Jr. et al. ...... 257/686 |
| 5,786,628 A | 7/1998 | Beilstein, Jr. et al. ...... 257/684 |
| 5,801,448 A | 9/1998 | Ball ............................ 257/778 |
| 5,889,658 A | 3/1999 | Sullivan et al. ............. 361/773 |
| 5,910,682 A | 6/1999 | Song .......................... 257/685 |
| 5,940,277 A | 8/1999 | Farnworth et al. .......... 361/760 |
| 5,956,236 A | 9/1999 | Corisis et al. .............. 361/783 |
| 5,990,566 A | 11/1999 | Farnworth et al. .......... 257/783 |
| 6,087,723 A | 7/2000 | Kinsman et al. ............. 257/727 |
| 6,088,237 A | 7/2000 | Farnworth et al. .......... 361/796 |
| 6,089,920 A | 7/2000 | Farnworth et al. .......... 439/632 |
| 6,091,606 A | 7/2000 | Farnworth et al. .......... 361/760 |
| 6,140,696 A | 10/2000 | Kinsman ..................... 257/678 |
| 6,147,411 A | 11/2000 | Kinsman ..................... 257/777 |
| 6,151,220 A | 11/2000 | Sakamoto et al. .......... 361/773 |
| 6,198,164 B1 | 3/2001 | Choi .......................... 257/723 |
| 6,235,551 B1 | 5/2001 | Farnworth et al. .......... 438/106 |
| 6,239,012 B1 * | 5/2001 | Kinsman ..................... 438/612 |

* cited by examiner

*Primary Examiner*—Richard Elms
*Assistant Examiner*—Beth E. Owens
(74) *Attorney, Agent, or Firm*—TraskBritt

(57) ABSTRACT

A vertically mountable semiconductor device is described includes a plurality of bond pads disposed proximate to a single edge thereof. The bond pads are bumped with an electrically conductive material. The semiconductor device may also include a support member. Alternatively, the semiconductor device may be laminated to one or more adjacent semiconductor devices. The present invention also includes a method of attaching the semiconductor device to a carrier substrate. Preferably, solder paste is applied to terminals on the carrier substrate. The semiconductor device is oriented vertically over the carrier substrate, such that the bumped bond pads align with their corresponding terminals. The bumps are placed into contact with the solder paste. The bumps and solder paste are then fused to form a joint between the each of the bond pads and their respective terminal, establishing an electrically conductive connection therebetween and imparting structural stability to the semiconductor device.

20 Claims, 2 Drawing Sheets

VERTICALLY MOUNTABLE SEMICONDUCTOR DEVICE AND METHODS

CROSS REFERENCE TO RELATED APPLICATION

This application is a continuation of application Ser. No. 09/407,482, filed Sep. 28, 1999, now U.S. Pat. No. 6,239,012, issued May 29, 2001, which is a divisional of application Ser. No. 09/014,053, filed Jan. 27, 1998, now U.S. Pat. No. 6,140,696, issued Oct. 31, 2000.

BACKGROUND OF THE INVENTION

1. Field of the Invention

The present invention relates to chip-on-board assemblies. Particularly, the present invention relates to vertically mountable, bare or minimally packaged semiconductor devices. The semiconductor devices to which the present invention relates include bond pads proximate an edge thereof In use, the solder bump establishes an electrical connection with a terminal of a carrier substrate, and supports the semiconductor device perpendicularly relative to the carrier substrate.

2. Background of Related Art

The direct attachment of a semiconductor device to a circuit board is known in the art as chip-on-board technology. Semiconductor devices that are directly mountable to a circuit board typically include bond pads along more than one edge thereof or in an area array over the active surface thereof. Methods for attaching semiconductor devices directly to a circuit board include flip-chip technology and tape automated bonding. Typically, when those techniques are employed, a semiconductor device is oriented over the circuit board and substantially parallel thereto in order to establish an electrical connection between the semiconductor device and the circuit board. After connecting such a semiconductor device to a circuit board, a protective coating may be applied over the semiconductor device.

However, the placement of a semiconductor device directly against a circuit board is somewhat undesirable in that, due to the parallel orientation of the semiconductor device relative to the circuit board and the typical placement of the semiconductor device's active surface thereagainst, heat must pass through both the circuit board and the semiconductor device in order to dissipate from the semiconductor device. Thus, the transfer of heat away from the semiconductor device is relatively slow. The horizontal orientation of the semiconductor device also consumes a great deal of "real estate" or area on the circuit board.

Vertical surface mount packages are also known in the art. When compared with traditional, horizontally mountable semiconductor packages and chip-on-board semiconductor devices, many vertical surface mount packages have a superior ability to transfer heat away from the semiconductor device. Vertical surface mount packages also consume less area on a circuit board than a horizontally mounted package of the same size. Thus, many skilled individuals in the semiconductor industry are finding vertical surface mount packages more desirable than their traditional, horizontally mountable counterparts and horizontally mountable chip-on-devices.

The following United States Patents disclose various exemplary vertical surface mount packages: U.S. Pat. No. Re. 34,794, issued to Warren M. Farnworth on Nov. 22, 1994; U.S. Pat. No. 5,444,304, issued to Kouija Hara and Jun Tanabe on Aug. 22, 1995; U.S. Pat. No. 5,450,289, issued to Yooung D. Kweon and Min C. An on Sep. 12, 1995; U.S. Pat. No. 5,451,815, issued to Norio Taniguchi et al. on Sep. 19, 1995; U.S. Pat. No. 5,592,019, issued to Tetsuya Ueda et al. on Jan. 7, 1997; and U.S. Pat. No. 5,635,760, issued to Toru Ishikawa on Jun. 3, 1997.

Many vertical surface mount packages in the prior art are somewhat undesirable in that they include leads which operatively connect a semiconductor device to a circuit board, the leads of such devices tend to increase the impedance and decrease the overall speed with which a device conducts electrical signals. Moreover, the packaging of many such devices adds to their undesirability. Typically, packaging requires multiple additional manufacturing steps, which translates into increased production costs. The packaging of many vertical surface mount packages also tends to consume a substantial amount of space on the circuit board.

U.S. Pat. No. 5,668,409 (the "'409 patent"), issued to Stephen Joseph Gaul on Sep. 16, 1997, discloses a vertically mountable, bare semiconductor die which includes bond pads along the edge thereof. The '409 patent discloses vertical mounting of that device to a circuit board by solder reflow techniques. However, that device is somewhat undesirable in that fabrication thereof requires several additional steps relative to the fabrication of typical chip-on-board semiconductor devices. The requirement of additional fabrication steps and the related requirement of additional fabrication materials increases the manufacturing cost of such semiconductor devices.

Thus, a vertically mountable bare semiconductor device is needed which has reduced impendence relative to devices in the prior art, has good thermal conductivity, and consumes less space on a circuit board. A method of mounting a bare or minimally packaged semiconductor device perpendicularly relative to a circuit board is also needed.

SUMMARY OF THE INVENTION

The semiconductor device of the present invention includes bond pads disposed proximate a single edge thereof. Placement of the bond pads proximate an edge of the semiconductor device facilitates direct vertical mounting of the semiconductor device to a carrier substrate. Thus, when such a semiconductor device is substantially perpendicularly mounted to a carrier substrate, packaging and leads are not necessary to establish an electrical connection between the bond pads and the corresponding terminals on the carrier substrate. The direct connection between the bond pads and substrate board contacts also imparts to the semiconductor device assembly of the present invention a low impedance characteristic.

A preferred mounting method according to the present invention includes the placement of a brick of solder paste on the carrier substrate terminals, orienting the semiconductor device perpendicularly relative to the carrier substrate, aligning the bond pads of the semiconductor device with their corresponding terminals, establishing contact between the bumps and the solder paste, and heating the bumps and solder paste to re-flow the solder and attach the bond pads to their respective terminals.

Other advantages of the present invention will become apparent through a consideration of the appended drawings and the ensuing description.

DETAILED DESCRIPTION OF THE INVENTION

Figure 1:
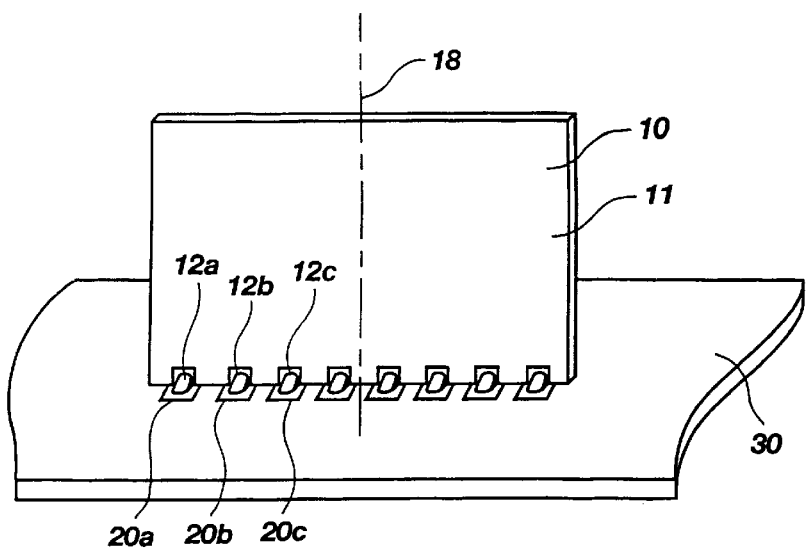
FIG. 1 is a frontal perspective view of a first embodiment of a semiconductor device-carrier substrate assembly according to the present invention.

FIG. 1 illustrates a semiconductor device 10 which has been vertically mounted to a carrier substrate 30. Solder joints 20a, 20b, 20c, etc. support semiconductor device 10 relative to carrier substrate 30.

Figure 2:
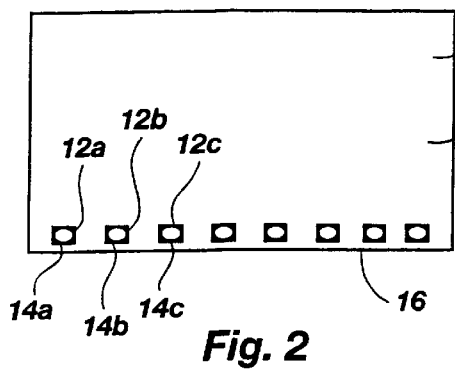
FIG. 2 is a front plan view of a first embodiment of a semiconductor device for use in the present invention.

Referring to FIG. 2, semiconductor device 10 is a semiconductor device of the type known and used in the industry, which includes circuit traces and active elements. The bond pads 12a, 12b, 12c, etc. of semiconductor device 10 are disposed on active surface 11, adjacent to a single edge 16 of the semiconductor device. Preferably, bond pads 12a, 12b, 12c, etc. are arranged in-line. Bond pads 12a, 12b, 12c, etc. may be disposed a short distance from edge 16, or their lower edges may be flush with the edge. Thus, during fabrication of semiconductor device 10, bond pads 12a, 12b, 12c, etc. are redirected to a location which is adjacent to edge 16. Methods and mechanisms which are known to those of ordinary skill in the art are useful for manufacturing semiconductor devices which are useful in the package according to the present invention. Such methods include the formation of electrical traces which lead to edge 16 and the fabrication of bond pads 12a, 12b, 12c, etc. adjacent to edge 16. Preferably, the fabrication steps which precede the formation of the electrical traces that lead to bond pads 12a, 12b, 12c, etc. and the formation of the bond pads are unchanged from their equivalent steps in the fabrication of prior art semiconductor devices. Thus, existing semiconductor device designs are useful in the package of the present invention with little modification and no increase in the number of fabrication.

A first semiconductor device 10 has a standardized number of bond pads 12a, 12b, 12c, etc., which are spaced apart from one another at a standardized pitch, and which may be positioned at a specific location relative to a center line 18 of the semiconductor device, or relative to any other landmark on the semiconductor device, such as a side thereof. Alternatively, semiconductor device 10 may include a non-standardized number and lateral spacing of bond pads 12. The placement of bond pads 12a, 12b, 12c, etc. proximal to edge 16 imparts semiconductor device 10 with reduced impedance as the bond pads are electrically connected to the carrier substrate (reference character 30 of FIG. 1), relative to many vertical surface mount packages and other packaged semiconductor devices in the prior art.

Preferably, bond pads 12a, 12b, 12c, etc. each include a bump 14a, 14b, 14c, etc. formed thereon. Bumps 14a, 14b, 14c, etc. are preferably formed from gold, gold alloy, or solder by techniques which are known in the art.

Figure 3A:
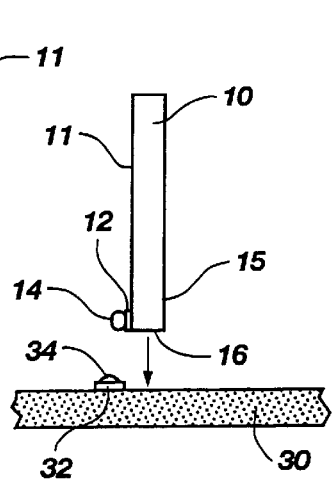
FIG. 3a is a side plan view of the semiconductor device of FIG. 2, illustrating placement of the semiconductor device on a carrier substrate.
Figure 3B:
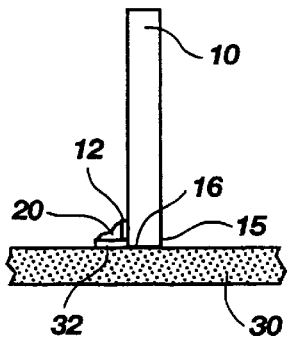
FIG. 3b is a side plan view of the semiconductor device of FIG. 2, illustrating a first preferred attachment of the semiconductor device to the carrier substrate.

With reference to FIG. 3a, a brick of solder paste 34 is disposed on each terminal 32 of carrier substrate 30. Typically, solder paste 34 is a mixture of solder powder, flux and a binder which keeps the solder powder and flux together. The preferred solder paste 34 and bump 14 materials have matched impedance to ensure optimum conditions for the transfer of electrical signals from carrier substrate 30 to semiconductor device 10 and from the semiconductor device to the carrier substrate. Preferably, solder paste 34 is applied to terminals 32 by techniques which are known in the art, including, without limitation, screen printing, stencil printing, pressure dispensing, and the use of solder preforms.

As semiconductor device 10 is positioned on carrier substrate 30, bump 14 contacts solder paste 34. Bump 14 and solder paste 34 are fused together to form a solder joint 20, which is also referred to as an electrically conductive joint. Solder joint 20 physically supports semiconductor device 10 relative to carrier substrate 30 in substantially a vertical orientation with respect thereto, and electrically connects bond pads 12 to their corresponding terminals 32. Preferably, known solder reflow techniques are employed to form solder joint 20. Solder reflow techniques include, but are not limited to, vapor-phase, infrared, hot gas, and other reflow methods. Other known soldering techniques are also useful for fusing bump 14 and solder paste 34 to electrically connect bond pad 12 to terminal 32. Alternatively, an electrically conductive joint 20 may be formed by placing a connector of electrically conductive epoxy or any other conductive element, including, without limitation, electrically conductive epoxies and z-axis elastomers, in contact with both bond pad 12 and terminal 32.

Figure 4A:
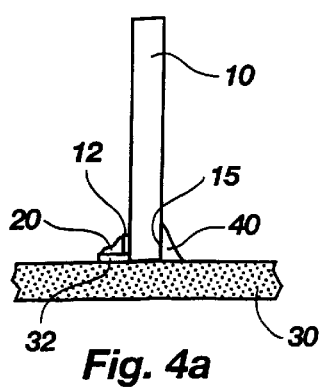
FIG. 4a is a side plan view of the semiconductor device of FIG. 2, illustrating an alternative embodiment of a support member between the semiconductor device and the carrier

Referring now to FIG. 4a, one or more support joints 40, which are also referred to as support footings or support members, may be placed between surface 15 of semiconductor device 10 and carrier substrate 30 (i.e., on the side of the semiconductor device opposite electrically conductive joint 20) to impart additional structural stability to the semiconductor device by stabilizing it from both sides. Preferably, support joint 40 is formed from materials such as epoxy potting compounds, acrylic compounds, silicone materials, resinous molding compounds, or other polymeric plastic materials which are known in the art. Preferably, the amount of material used to form support joint 40 is sufficient to support semiconductor device 10, yet minimal in order to optimize the transfer of heat away from the semiconductor device and preserve surface area on the carrier substrate.

Figure 4B:
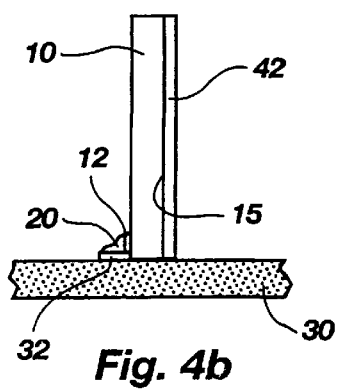
FIG. 4b is a side plan view of the semiconductor device of FIG. 2, illustrating an alternative embodiment of a support member between the semiconductor device and the carrier substrate.

Referring to FIG. 4b, alternatively or in combination with support joint 40, semiconductor device 10 may include a support layer 42, which is also referred to as a support member, on at least a portion of surface 15. Support layer 42 imparts additional structural support to semiconductor device 10. The materials which are useful for forming support joint 40 are also useful for forming support layer 42. Support layer 42 may be applied to surface 15 by techniques which are known in the art, including without limitation, lamination and adhesive bonding. Alternatively, support layer 42 may be manufactured from materials having good thermal conductivity, such as copper, aluminum, other metals, metal alloys, and ceramics.

Figure 5A:
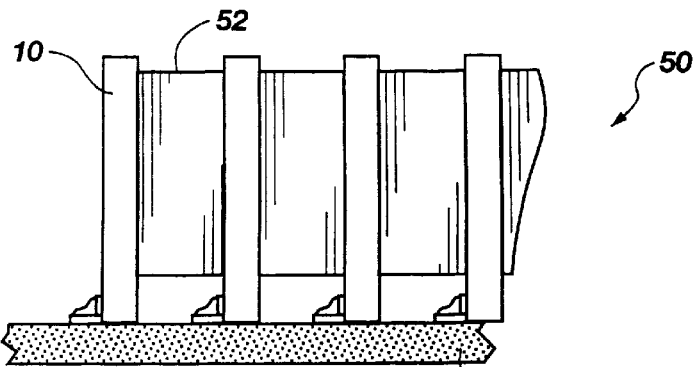
FIG. 5a is a side plan view of a series of laminated semiconductor devices.
Figure 5B:
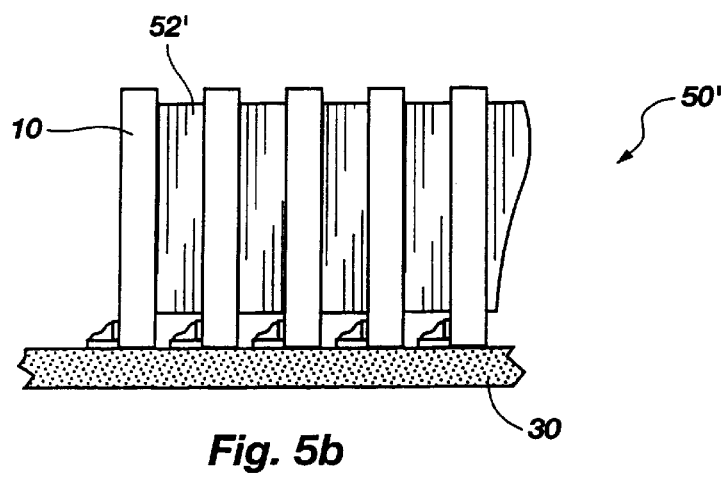
FIG. 5b is a side plan view of an alternative embodiment of a series of laminated semiconductor devices.

FIGS. 5a and 5b illustrate a laminated module 50 which includes a plurality of adjacent semiconductor devices 10 that is bonded together with a layer of laminate 52. When mounted to carrier substrate 30, laminated module 50 has greater structural stability than a vertically mounted semiconductor device such as that illustrated in FIG. 1. Laminate 52 may be formed from the same types of materials that are useful as support layer 42, described above in reference to FIG. 4b. Preferably, laminate 52 is manufactured from a material which is a good thermal conductor. Thus, during operation of each semiconductor device 10, laminate 52 facilitates the transfer of heat away from the semiconductor devices attached thereto.

The laminates 52 and 52' of laminated modules 50 and 50' of FIGS. 5a and 5b, respectively, have different thicknesses. Thinner laminates 52' are preferred from the standpoint that the number of semiconductor devices 10 that are attachable to a given area of the carrier substrate 30 is maximized as the thickness of the laminate layer is minimized.

Figure 6:
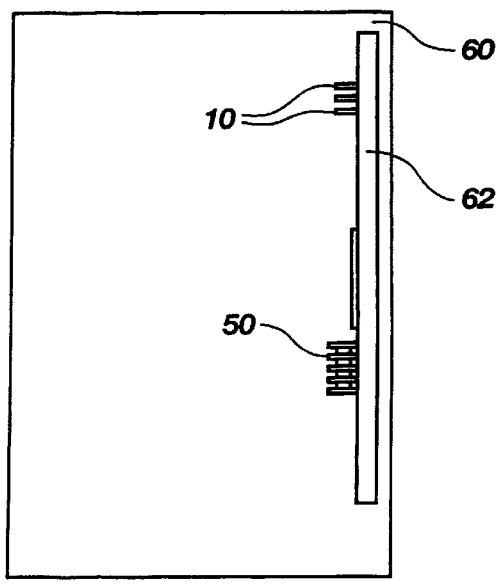
FIG. 6 is a schematic representation of the present invention in a computer.

FIG. 6 illustrates a computer 60 including a circuit board 62. Semiconductor device 10 and laminate module 50 are attached to circuit board 62 in a manner which establishes an electronic connection between the semiconductor devices and the circuit board. Thus, with the attachment of semiconductor device 10 and/or laminate module 50 to circuit board 62, the semiconductor device and/or module is operatively associated with computer 60.

Advantageously, the bond pads of the semiconductor device, which are disposed adjacent an edge thereof, may be directly connected to corresponding terminals on a carrier substrate. Thus, the additional impedance that is typically generated by package leads is significantly reduced. The placement of bond pads on the semiconductor device also facilitates the substantial vertical mounting arrangement of the semiconductor device to a carrier substrate, which, when combined with a convection-type air circulation system, facilitates heat transfer away from the semiconductor device. Preferably, the semiconductor device is bare or minimally packaged, reducing the space consumption thereof relative to vertical surface mount packages and horizontally mountable semiconductor devices and packages. Further, fabrication of the device requires no additional steps relative to the fabrication of many similar semiconductor devices in the prior art. The assembly method of the present invention orients the semiconductor device perpendicularly relative to the carrier substrate.

Although the foregoing description contains many specificities, these should not be construed as limiting the scope of the present invention, but merely as providing illustrations of some of the presently preferred embodiments. Similarly, other embodiments of the invention may be devised which do not depart from the spirit or scope of the present invention, indicated by the appended claims and their equivalents.

What is claimed is:

1. A method for reconfiguring a connection pattern of a preexisting semiconductor device design, comprising:
    fabricating a semiconductor device of the preexisting design;
    fabricating electrical traces that extend toward a single edge of said semiconductor device and communicate with internal circuitry thereof; and
    forming a plurality of bond pads on said semiconductor device, adjacent a single edge thereof, each bond pad of said plurality of bond pads communicating with a corresponding one of said electrical traces.

2. The method of claim 1, wherein said forming said plurality of bond pads comprises forming each bond pad of said plurality of bond pads in-line with other bond pads of said plurality of bond pads.

3. The method of claim 1, wherein said forming comprises forming each bond pad of said plurality of bond pads on an active surface of said semiconductor device.

4. The method of claim 1, further comprising positioning a discrete conductive element on at least one bond pad of said plurality of bond pads.

5. A method for securing a semiconductor device nonparallel relative to a substrate, comprising:
    aligning bond pads located adjacent a single edge of the semiconductor device with corresponding terminals of the substrate; and
    positioning discrete conductive elements between bond pads located adjacent said single edge and corresponding, aligned terminals of the substrate.

6. The method of claim 5, wherein said positioning comprises forming said discrete conductive elements between said bond pads and said corresponding, aligned terminals.

7. The method of claim 5, wherein said positioning comprises placing said discrete conductive elements between said bond pads and said corresponding, aligned terminals.

8. The method of claim 5, further comprising positioning at least one support structure adjacent said single edge of the semiconductor device, said at least one support structure being configured to maintain the nonparallel position of the semiconductor device relative to the substrate.

9. The method of claim 8, wherein said positioning said at least one support structure comprises positioning said at least one support structure on a surface of the semiconductor device opposite a surface on which said bond pads are located.

10. A method for securing a semiconductor device in nonparallel relation to a substrate, comprising:
    positioning the semiconductor device adjacent the substrate with a plurality of bond pads on an active surface of the semiconductor device and adjacent a single edge thereof being aligned with corresponding terminals of the substrate; and
    electrically connecting each bond pad of said plurality of bond pads to a corresponding terminal of said terminals.

11. The method of claim 10, wherein said electrically connecting comprises positioning a discrete conductive element between each bond pad of said plurality of bond pads and said corresponding terminal.

12. The method of claim 11, wherein said positioning said discrete conductive element comprises forming said discrete conductive element.

13. The method of claim 11, wherein said positioning said discrete conductive element comprises placing a preformed discrete conductive element between each bond pad and said corresponding terminal.

14. The method of claim 11, wherein said positioning said discrete conductive element comprises supporting the semiconductor device in nonparallel relation to the substrate.

15. The method of claim 10, further comprising positioning at least one support structure between at least said single edge of the semiconductor device and the substrate.

16. The method of claim 15, wherein said positioning said at least one support structure comprises maintaining a position of the semiconductor device relative to the substrate.

17. A method for designing a semiconductor device, comprising:

configuring at least one active element;

configuring a plurality of bond pad locations adjacent a single edge of the semiconductor device; and configuring a plurality of conductive trace locations, each of said plurality of conductive trace locations configured to facilitate communication between said at least one active element and a corresponding bond pad location of said plurality of bond pad locations.

18. The method of claim 17, wherein said configuring said plurality of bond pad locations comprises configuring each bond pad location of said plurality of bond pad locations to be substantially in-line with other bond pad locations of said plurality of bond pad locations.

19. The method of claim 17, wherein said configuring said plurality of bond pad locations comprises configuring each of said plurality of bond pad locations to be positioned correspondingly to a terminal of a substrate to which the semiconductor device is to be secured in nonparallel relation.

20. The method of claim 19, further comprising configuring a plurality of discrete conductive elements to connect each bond pad location of said plurality of bond pad locations to said corresponding terminal of the substrate upon placement of the semiconductor device adjacent the substrate in nonparallel relation thereto.

* * * * *

UNITED STATES PATENT AND TRADEMARK OFFICE
CERTIFICATE OF CORRECTION

PATENT NO. : 6,383,839 B2
DATED : May 7, 2002
INVENTOR(S) : Larry D. Kinsman

It is certified that error appears in the above-identified patent and that said Letters Patent is hereby corrected as shown below:

Title page,
Item [56], References Cited, U.S. PATENT DOCUMENTS, before "5/2001" delete "*"

Item [57], ABSTRACT,
Line 1, delete "is described"

Column 1,
Line 21, insert a period after "thereof"
Line 62, change "chip-on-devices" to -- chip-on-board devices --

Column 3,
Line 12, after "carrier" insert -- substrate; --
Line 55, after "fabrication" and before the period insert -- steps --

Signed and Sealed this

Twenty-ninth Day of July, 2003

JAMES E. ROGAN
*Director of the United States Patent and Trademark Office*